United States Patent [19]

Higbie

[11] Patent Number: 5,018,088

[45] Date of Patent: May 21, 1991

[54] ADAPTIVE LOCALLY-OPTIMUM DETECTION SIGNAL PROCESSOR AND PROCESSING METHODS

[75] Inventor: James H. Higbie, Catonsville, Md.

[73] Assignee: The Johns Hopkins University, Baltimore, Md.

[21] Appl. No.: 415,697

[22] Filed: Oct. 2, 1989

[51] Int. Cl.⁵ .............................................. G01T 1/16
[52] U.S. Cl. ...................................... 364/574; 375/1
[58] Field of Search ............... 375/1; 364/724.01, 574, 364/554, 514

[56] References Cited

U.S. PATENT DOCUMENTS

| | | | |
|---|---|---|---|
| 3,478,268 | 11/1969 | Coviello | 325/65 |
| 3,605,018 | 9/1971 | Coviello | 325/65 |
| 3,833,797 | 9/1974 | Grobman et al. | 235/151.3 |
| 3,867,712 | 2/1975 | Harthill et al. | 340/6 R |
| 3,889,108 | 6/1975 | Cantrell | 235/152 |
| 3,949,309 | 4/1976 | Pecar | 325/473 |
| 4,017,859 | 4/1977 | Medwin | 343/100 CL |
| 4,031,364 | 6/1977 | Wilmot | 235/151.3 |
| 4,207,624 | 6/1980 | Dentino et al. | 367/135 |
| 4,243,935 | 1/1981 | McCool et al. | 324/77 R |
| 4,270,223 | 5/1981 | Marston | 455/305 |
| 4,287,475 | 9/1981 | Eaton et al. | 328/167 |
| 4,349,916 | 9/1982 | Roeder | 375/103 |
| 4,355,368 | 10/1982 | Zeidler et al. | 364/728 |
| 4,361,891 | 11/1982 | Lobenstein et al. | 375/1 |
| 4,530,076 | 7/1985 | Dwyer | 364/574 |
| 4,594,695 | 6/1986 | Garconnat et al. | 367/135 |
| 4,613,978 | 9/1986 | Kurth et al. | 375/99 |
| 4,621,365 | 11/1986 | Chic | 375/1 |
| 4,710,723 | 12/1987 | Pelchat et al. | 329/192 |
| 4,727,504 | 2/1988 | Van Broekenhoren | 364/724.01 |
| 4,774,682 | 9/1988 | White | 364/554 |
| 4,791,577 | 12/1988 | Winter | 364/574 |
| 4,792,915 | 12/1988 | Adams et al. | 364/724.19 |
| 4,811,261 | 3/1989 | Kobayashi et al. | 364/724.19 |
| 4,837,720 | 6/1989 | Rambaut | 364/574 |
| 4,843,583 | 6/1989 | White et al. | 364/724.19 |

OTHER PUBLICATIONS

D. Middleton, "Statistical Theory of Signal Detection," Symposium on Statistical Methods in Communications Engineering, IRE Trans. Info. Theor., PGIT-3, No. 26 (1954) pp. 26–51.

A. D. Spaulding and D. Middleton, "Optimum Reception in an Impulsive Interference Environment," *IEEE Trans. Commun.* COM-25, No. 9, pp. 910–934 (Sep. 1977).

A. D. Spaulding, "Locally Optimum and Suboptimum Detector Performance in a Non-Gaussian Interference Environment," *IEEE Trans. Commun.*, COM-33, No. 6 (Jun. 1985) pp. 509–517.

*Primary Examiner*—Salvatore Bangialosi
*Attorney, Agent, or Firm*—Robert E. Archibald; Francis A. Cooch

[57] ABSTRACT

A signal processing technique is described which suppresses interference in spread-spectrum communications receive systems by optimizing the detection process dynamically against the current interference. This is accomplished by estimating the statistics of the interference and then using this information to derive the locally-optimum mapping to apply to the signal of interest plus interference. As the statistics of the interference change, the measured distributions and the resulting transformations also change. The adaptation is open loop so convergence problems do not arise.

30 Claims, 10 Drawing Sheets

Input signal plus constant-amplitude interference

Test waveform (data = 1)

Test waveform (data = 0)

Output signal plus interference after hole-punching

Output signal plus interference after limiter/cancelling

ADAPTIVE LOCALLY-OPTIMUM DETECTION SIGNAL PROCESSOR AND PROCESSING METHODS

STATEMENT OF GOVERNMENTAL INTEREST

The Government has rights in this invention pursuant to Contract No. N00039-89-C-5301 awarded by the Department of the Navy.

BACKGROUND OF THE INVENTION

The invention relates to signal processing and, more specifically, to a processor and processing methods designed to suppress interference in an input signal and, hence, to decrease degradation of a signal of interest caused by the presence of such interference.

The invention is especially applicable to spread spectrum communications signal processors or to other situations where the signal of interest is to be detected by a correlation process and the interference (a) is much stronger than the signal of interest, and (b) can be characterized by greater predictability than simple white Gaussian (random) noise.

In a single-input communications signal processor, the input signal typically is sampled and the output signal is synthesized at discrete times. At any time, the output signal is then some function of the input signal at such discrete times with the function or transformation defining the signal processing. (Herein function, transformation and mapping are used interchangeably to mean a mathematical relationship/correspondence between two sets, e.g., signal input and output. A function/transformation/mapping that is nonlinear may be termed a nonlinearity for short.)

The most common single-input signal processors for interference suppression are linear, i.e., the function determining the output can be expressed as a sum of the inputs at each sample time, multiplied by constants. Such a processor is simply a filter, and is effective at suppressing interference only if the normalized power spectrum (the power distribution by frequency of the interference is not equal to that of the signal of interest.

An additional limitation of some linear signal processors is that those that are designed to adapt to the interference environment usually do so by means of an iterative approach in which the results of the processing currently being performed are inspected and used to compute modifications to the signal processing parameters. Such iterative approaches can be slow to adapt and may adapt inappropriately under certain conditions.

Linear signal processors have been studied extensively and their properties are well known. A sampling of such processors can be found in U.S. Pat. Nos. 4,811,261 to Kobayashi et al; 4,243,935 to McCool et al; 4,207,624 to Dentino et al; 3,889,108 to Cantrell; and 3,867,712 to Harthill et al.

In some signal processors the function used to generate an output signal cannot be put into linear form. In general, such nonlinear processes are much less familiar than linear ones to those with ordinary skill in the art, and their effects are more difficult to predict. One of the best known types of nonlinearity is that having zero memory, that is, the output at time t depends only on the input at that same time. A brief description of two simple zero-memory nonlinearities will help clarify how such processing works.

The first type of nonlinearity is used in cases when the interference to be suppressed is impulsive, that is, it consists largely of isolated pulses. Examples are pulse jammers, motor vehicle ignition noise, and atmospherics.

FIG. 1a shows an input signal tainted with a pulse from such an interference source. As a specific example, the signal processor might be trying to decode a phase-keyed signal, to determine whether a data bit (FIG. 1b) or data bit 0 (FIG. 1c) was sent. The processor computes the correlation of the input signal with each of the test waveforms (data 0 and 1) and chooses the one whose correlation is the greatest. In the example shown, one can see that although the true signal of interest was the data 1 waveform, the interference, during its pulse, happens to correlate strongly with the data 0 waveform. As a result, if the interference pulse is strong enough, it will outweigh the signal of interest in the correlation sum and cause a received error.

If the interference environment is known in advance, the assumption can be made that the weak part of the waveform in FIG. 1a is the signal of interest and the strong part is the interference. To improve detection of the signal of interest, the processor could then disregard the high-level input signal samples since they are dominated by interference. This suggests using a zero-memory nonlinearity in which a cutoff threshold, $A_t$, is set just above the maximum level of the desired signal of interest (dotted line in FIG. 1a). $A_x$ is the "envelope" amplitude of x (dashed line in FIG. 1a). When $A_x \geq A_t$, the nonlinearity reduces the output to zero.

When this nonlinearity is applied to the input waveform of FIG. 1, it produces the output, FIG. 1d, which is then correlated against the data 0 and 1 waveforms, i.e., the output waveform is multiplied sample by sample by the test waveform and the resulting products are summed. Although some of the signal of interest is lost during the interference pulse, all of the interference is suppressed and the correct data decision will be made. This nonlinearity is called a "hole puncher," and is just one of many possible limiters used to reduce the impact of impulsive interference by de-emphasizing large-amplitude parts of an input waveform. See, e.g., U.S. Pat. No. 4,530,076 to Dwyer. A frequency-domain analog is described in U.S. Pat. No. 4,613,978 to Kurth et al.

A second zero-memory nonlinearity is that used against constant-amplitude interference. This interference has amplitude behavior that is just the opposite of impulsive interference, and suppressing it requires a very different nonlinearity. An input waveform is shown in FIG. 2a. It is dominated by an interference waveform with peak amplitude, A. A weak signal of interest, the same as in FIG. 1, is also present. The input signal of interest-plus-interference sum fluctuates, its peak amplitude, $A_x$, surpassing A when signal of interest and interference are in phase and add constructively, and filling short of A when the signal of interest and interference are out of phase and tend to cancel. The correlation sum formed by the processor will indicate the wrong data if the interference is strong enough and out of phase with the signal of interest for a large enough fraction of the correlation period.

In the case of strong constant-amplitude interference, it is clear that when the input signal envelope is greater than A, the signal of interest is in phase with the interference and the input waveform can be used as an estimate of the signal of interest. Conversely, when the input signal envelope is less than A, the signal of interest must be out of phase with the interference and can be estimated as the negative of the input waveform. Moreover, the more the peak amplitude deviates from A, the more exactly the signal of interest must be in (or out of) phase with the interference and the better it is estimated as the input waveform (or its negative).

A reasonable nonlinearity to use against constant-amplitude interference might therefore produce an output with the same phase as that of the input, but with an amplitude proportional to the difference between $A_x$ and A. This process is sometimes called a "limiter/canceller". See, e.g., U.S. Pat. Nos. 4,710,723 to Pelchat et al; 4,270,223 to Marston; and 3,605,018 and 3,478,268 both to Coviello.

Note that unlike the linear processes, such as filters, and other techniques such as sine-wave cancellation (U.S. Pat. Nos. 4,349,916 to Roeder; 3,949,309 to Pecar; and 4,287,475 to Eaton et al), these nonlinear processes do not depend on any particular frequency characteristics on the part of the interference. For example, a limiter/canceller can greatly improve detection of a weak phase-keyed signal of interest in the presence of a much stronger constant-amplitude phase-keyed interference source, even though the interference power is distributed in frequency exactly the same as the signal of interest and therefore cannot be suppressed by single-input filtering.

However, "hole punchers"; limiter/cancellers; and other nonlinear techniques intended for use against specific interference types do not usually implement adaptive estimates of the interference of the moment as does the invention described and claimed herein. Previous adaptive nonlinear techniques (see, e.g., U.S. Pat. Nos. 4,792,915 to Adams et al; 4,774,682 to White; 4,530,076 to Dwyer; and 3,833,797 to Grobman et al) do not implement optimum signal detection transforms based on the full probability distribution of interference variables, and therefore do not suppress as broad a range of interference types as effectively as does the invention described and claimed herein. Further, the invention also does not need the multiple inputs found in, e.g., directional antenna combining (U.S. Pat. Nos. 4,355,368 to Zeidler et al and 4,017,859 to Medwin) or reference interference subtraction (No. 4,594,695 to Garconnat et al).

SUMMARY OF THE INVENTION

The present invention relates generally to a processor and processing methods which provide adaptive locally-optimum detection. Local means that the interference is much stronger than the signal of interest, i.e., the sum of the interference plus signal of interest is near or local to the interference alone. Optimum refers to the best nonlinearity of a given class, e.g., zero-memory amplitude transformations, to suppress the interference. (See, e.g., D. Middleton, "Statistical Theory of Signal Detection," Symposium on Statistical Methods in Communications Engineering, IRE Trans. Info. Theor., PGIT-3, no. 26 (1954); A. D. Spaulding and D. Middleton, "Optimum Reception in an Impulsive Interference Environment, "IEEE Trans. Commun. COM-25, no. 9, pp. 910-934 (Sept. 1977); and A. D. Spaulding, "Locally Optimum and Suboptimum Detector Performance in a Non-Gaussian Interference Environment, "IEEE Trans. Commun., COM-33, no. 6 (June 1985).)

The ability to adapt is crucial, since the interference statistics/characteristics determine what processing is appropriate (as the examples above illustrated), and those characteristics cannot always be anticipated. If a signal processor fails to adapt, it may easily aggravate, rather than suppress, the impact of the interference.

Hitherto, nonlinear processing has been implemented with only very limited adaptation, such as varying the clipping or hole-punching threshold, $A_t$. The invention described and claimed herein permits applying a much broader class of nonlinear processes than just hole punchers and limiter/cancellers by implementing a general zero-memory amplitude nonlinearity, $$y = f(A_x)e^{j\phi x} \quad (1)$$
where $x = A_x e^{j\phi x}$ is the input signal at some time
and $y = A_y e^{j\phi y}$ is the input signal at the same time.

Additionally, the invention implements nonlinearities which have memory and which act on phase components of the input signal As noted above, linear signal processing methods usually use an iterative approach which can be slow to adapt and may adapt inappropriately. The invention, on the other hand, adapts without iteration by analyzing the interference environment and computing the optimum nonlinearity at each sample time. This method is free of the convergence and stability problems of iterative adaptation.

DETAILED DESCRIPTION OF THE INVENTION

Figure 1A:
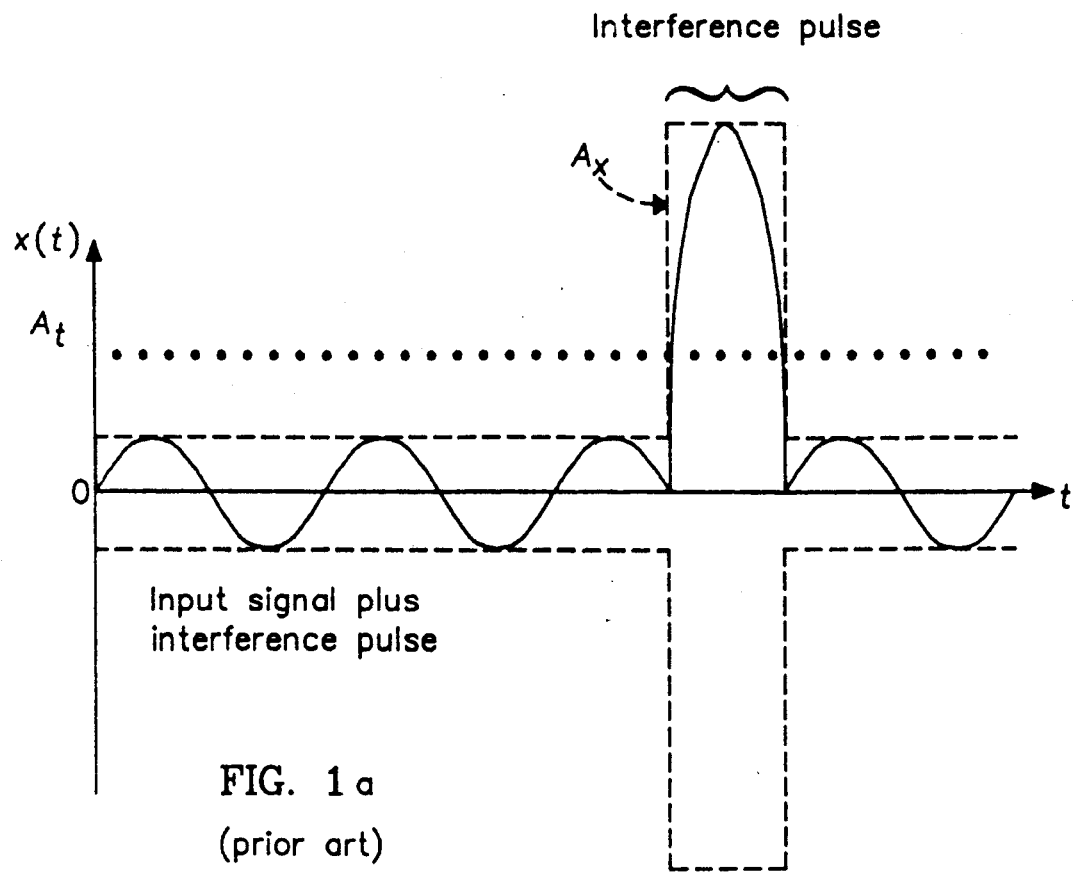
FIG. 1, consisting of FIGS. 1a, 1b, 1c and 1d is a set of waveform plots illustrating the application of a "hole puncher" nonlinearity to suppress impulsive interference.
Figure 1B:
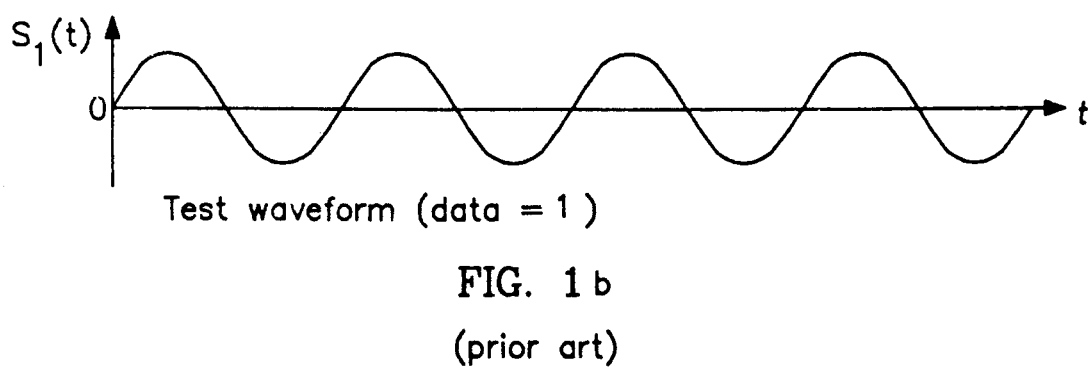
Figure 1C:
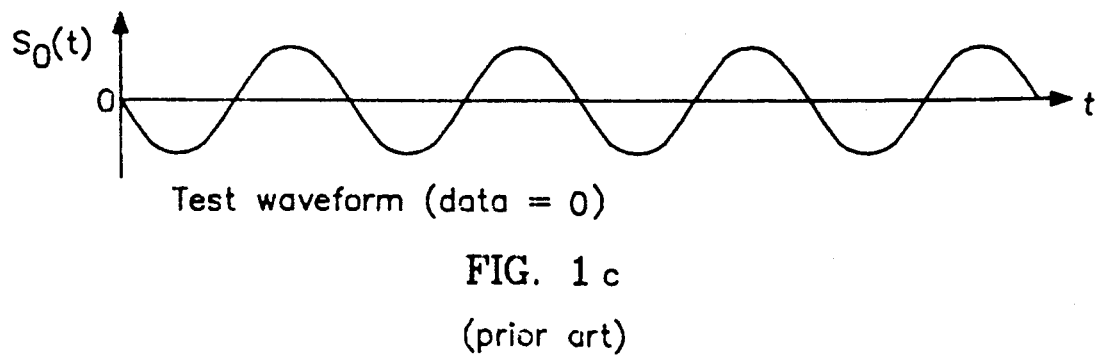
Figure 2A:
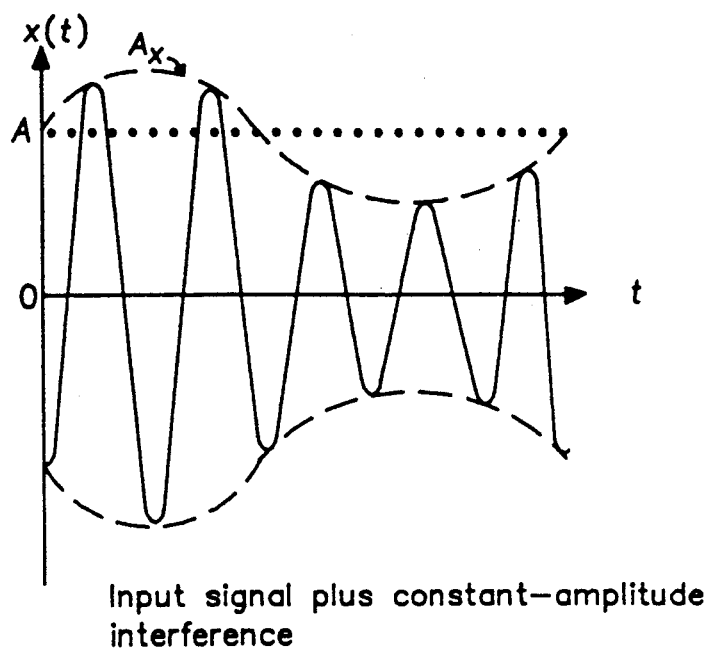
FIG. 2, consisting of FIGS. 2a, 2b, 2c and 2d, is a set of waveform plots illustrating the application of a "limiter/canceller" nonlinearity to suppress constant-amplitude interference.
Figure 2B:
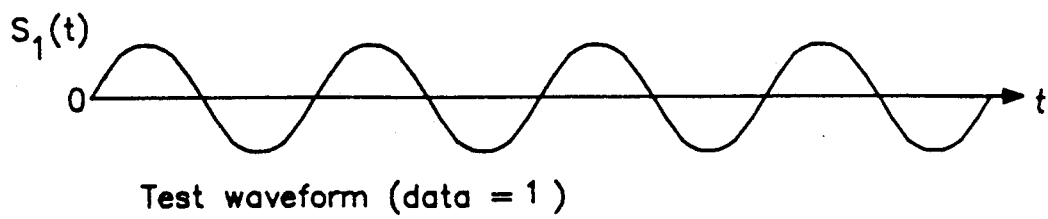
Figure 2C:
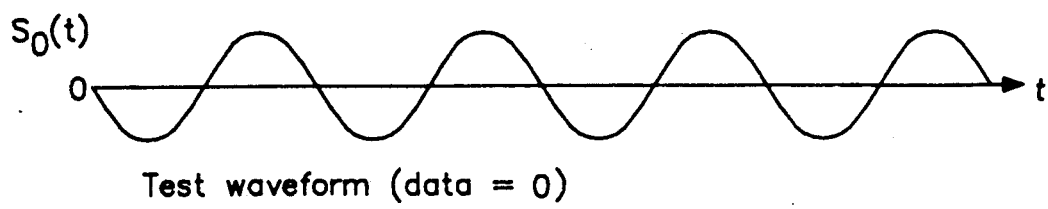
Figure 1D:
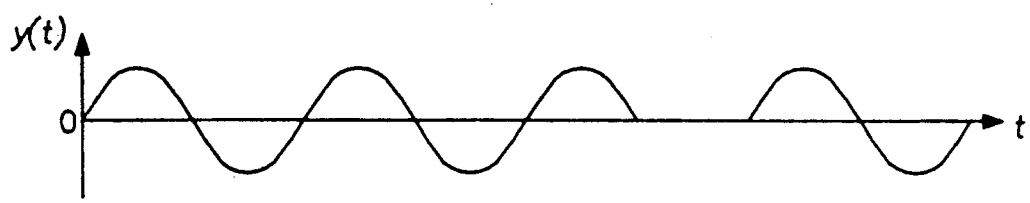
Figure 2D:
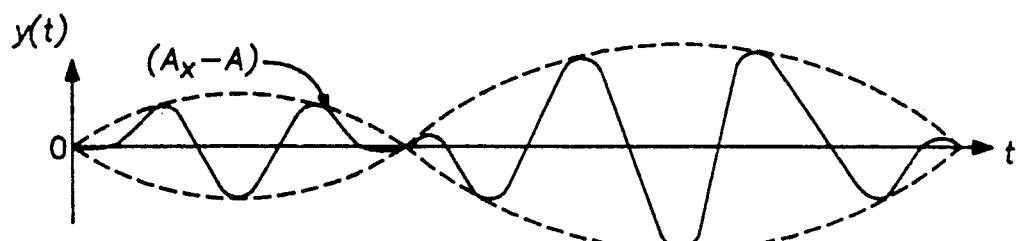

In order to adapt the nonlinearity o the interference environment of the moment, the interference environment must be characterized by estimating its statistics at each sample time. This is done by utilizing at least one dynamic variable of the input signal. Variables are chosen based on the type(s) of interference which the signal processor is required to suppress. Possible variables are:

(a) envelope amplitude,
(b) phase velocity,
(c) in-phase and quadrature amplitudes,
(d) higher-order time derivatives of any of the above,
(e) Fourier transform (real) amplitude of (c),
(f) Fourier transform phase slope (vs. frequency) of (c).

Joint multivariate distributions based on two or more variables are also possible.

A preferred embodiment of the invention is to use amplitude and phase velocity as discussed below. Use of amplitude as a variable is particularly effective against peak-power limited interference sources since locally-optimum detection provides significant suppression of interference which stays at or near a fixed amplitude much of the time.

Use of phase velocity as a variable suppresses interference with non-uniformly distributed phase velocity. For example, it can suppress narrowband interference, as a filter does, but also wideband modulations with some phase predictability, such as frequency-shift and phase-shift keying waveforms.

A second preferred embodiment of the invention is to use Fourier transforms (variables (e) and (f) above). In this case the amplitude and phase information from all frequencies is used to arrive at a set of amplitude and phase probability distributions which are then used to generate a transformation to be applied to all frequency components equally. Prior art signal processing which works in the Fourier transform, i.e., frequency, domain normally operates on each frequency component essentially independently (as in Nos. 4,017,859 to Medwin; 4,355,368 to Zeidler; 4,594,695 to Garconnat; and 4,613,978 to Kurth et al), or at most using information from adjacent frequencies (as in No. 4,330,076 to Dwyer). The Fourier transform processing used by this embodiment of the invention is novel in its use of all frequency components to totally determine the processing at each frequency.

The mathematical derivation of the locally-optimum nonlinearity when envelope amplitude is the dynamic variable being characterized is now presented (Equations (2)-(4) below). When using envelope amplitude, the statistics of the interference which must be estimated are given by the amplitude probability distribution (APD). Under the special condition that the signal of interest is much weaker than the interference, the APD can be estimated easily, since the input signal of interest-plus-interference, whose amplitudes can be measured directly, is a good approximation to the interference alone. Also, the optimum nonlinearity for weak signals is especially simple to calculate from the interference APD. As noted previously, it is this weak signal assumption that underlies the method of the invention.

The assumption that the signal of interest is much weaker than the interference is reasonable, since the method of the invention is designed to work on spread-spectrum communication links that do not begin to encounter problems until the interference level is already substantially higher than that of the signal. The method's net effect is to bring the interference level down toward that of the signal of interest. A communication processor with processing gain (a de-band-spreader and/or decoder) is then required to extract the signal of interest.

The signal processor of the invention estimates the interference APD by assuming that the input amplitudes measured during a period of time are statistically representative. Once an interference APD is estimated, for example that shown in FIG. 3, the optimum nonlinearity for detecting a weak signal is computed as follows: For any measured input signal of interest-plus-interference amplitude, $A_x$, the likely correlation of the signal of interest, S, with the measured input, x, (and therefore also with the interference, I) is determined by comparing the relative probabilities of S and I being exactly in phase or 180° out of phase (In fact, the phase angle between S and I can be anything, but the derivation can be grasped intuitively by ignoring the two-dimensional nature of the problem and looking at the simplified one-dimensional situation plotted in FIG. 3.)

Figure 3:
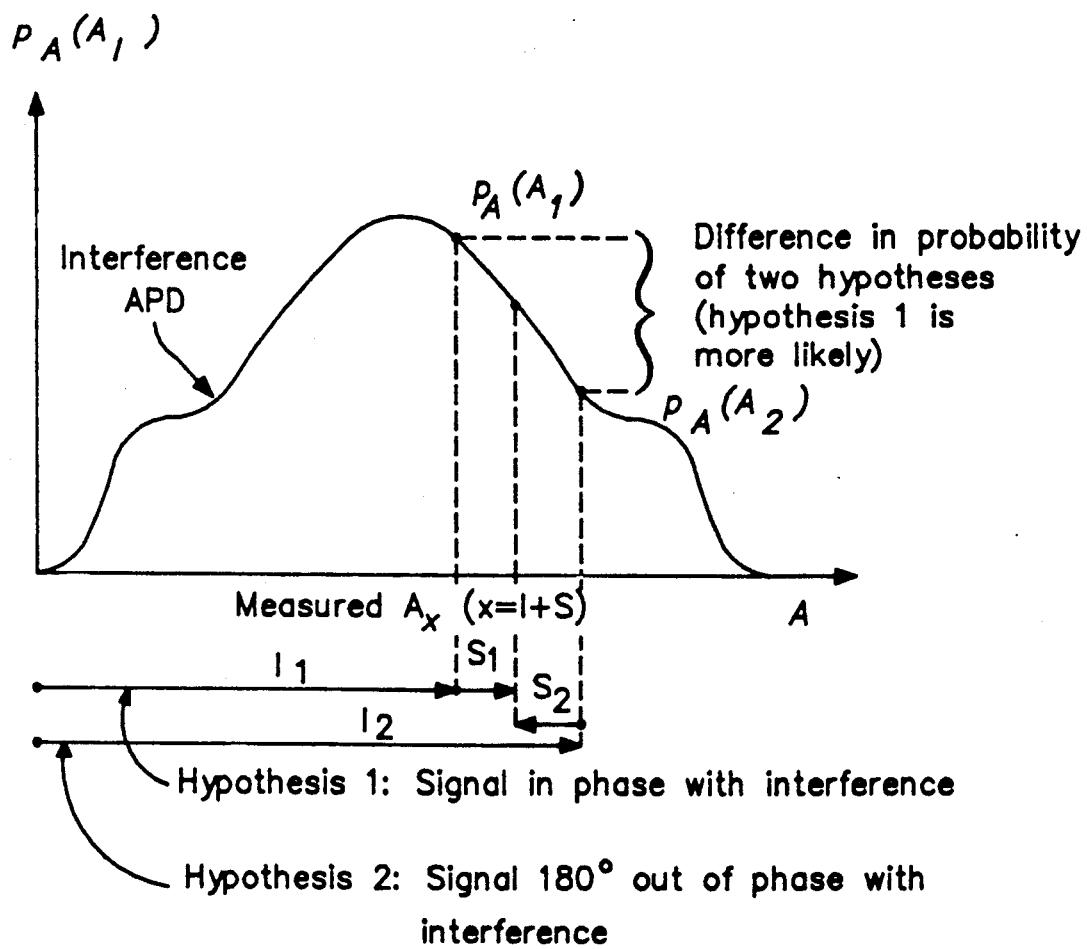
FIG. 3 illustrates a plot of interference amplitude probability distribution.

Roughly speaking, if the APD has a slope at the measured point, the probabilities of S and I being in or out of phase are not equally likely and the optimum output amplitude should be positive (in phase with the input) or negative (out of phase with the input) depending on whether that slope is negative or positive. In FIG. 3, the lower interference amplitude is more likely so the chances are that the signal was in phase with the interference and therefore with the input, and the output amplitude is positive.

The steeper the slope of the APD, the more likely it is that the estimate of signal phase is correct and the more strongly the sample should be weighted in the overall correlation sum. In other words, the magnitude of the output amplitude should vary with the APD slope It is straightforward to develop the optimum nonlinearity as the expectation value of the signal, $<S>$:

$$y = <S> = A_y e^{j\phi_x}, \qquad (2)$$
where $$A_y = -\left(\frac{A_s^2}{2}\right)\frac{\left(\frac{d}{dA_x}\right)\left(\frac{p_A(A_x)}{A_x}\right)}{\left(\frac{p_A(A_x)}{A_x}\right)}.$$

Equation (Eq.) (2) provides the desired nonlinearity, $f(A_x)$, to be used. It is known as the locally (i.e., small signal) optimum detector. With regard to Eq. (2)

a. The approximation that the input is roughly equal to the interference has been used freely.
b. It is not necessary to know the amplitude of the desired signal, $A_x$, so long as it is constant, since multiplying the output by a positive constant will not affect the receiver's data decoding decisions.
c. The variable $p_A(A_x)$ is the probability density function for the interference amplitude, estimated by making many measurements of the input amplitude. It is divided by $A_x$ to correct for the nonuniformity of polar coordinates (Because A, $\phi$ are polar coordinates, $dAd\phi$ is not a constant area but is proportional to A. As a result, the probability of occupying a unit area at $A = A_x$ in the A, $\phi$ plane is $p_A(A_x)/A_x$.)

What does the nonlinearity, Eq. (2), look like under various interference environments? In Gaussian noise, the APD is:

$$p_A(A_1) = \left(\frac{2A_1}{A^2}\right)e^{-\frac{A_1^2}{A^2}},$$

where $A_I$ is the interference amplitude and A is the root-mean-square (rms) amplitude. Plugging this interference APD into Eq. (2) gives:

$$A_y = \left(\frac{A_s}{A}\right)^2 A_x,$$

which is equivalent to $A_y = A_x$, since $A_s/A$ is constant.

In other words, against Gaussian interference, the optimum zero-memory amplitude process is linear and trivial: Output equals input. Whenever the interference environment is assumed to be Gaussian, the optimum process doesn't include any zero-memory amplitude nonlinearity. Conversely, it is easy to show that if the interference amplitude characteristics are not Gaussian, Eq. (2) always leads to a nonlinear process.

Atmospheric noise, as a second example, is markedly non-Gaussian. It is characterized by frequent clusters of noise pulses that rise far above the mean level. As a result, there is a much greater likelihood of high amplitudes for atmospherics than for Gaussian noise of the same rms amplitude. Quiet periods between noise clusters are also more likely.

Figure 4A:
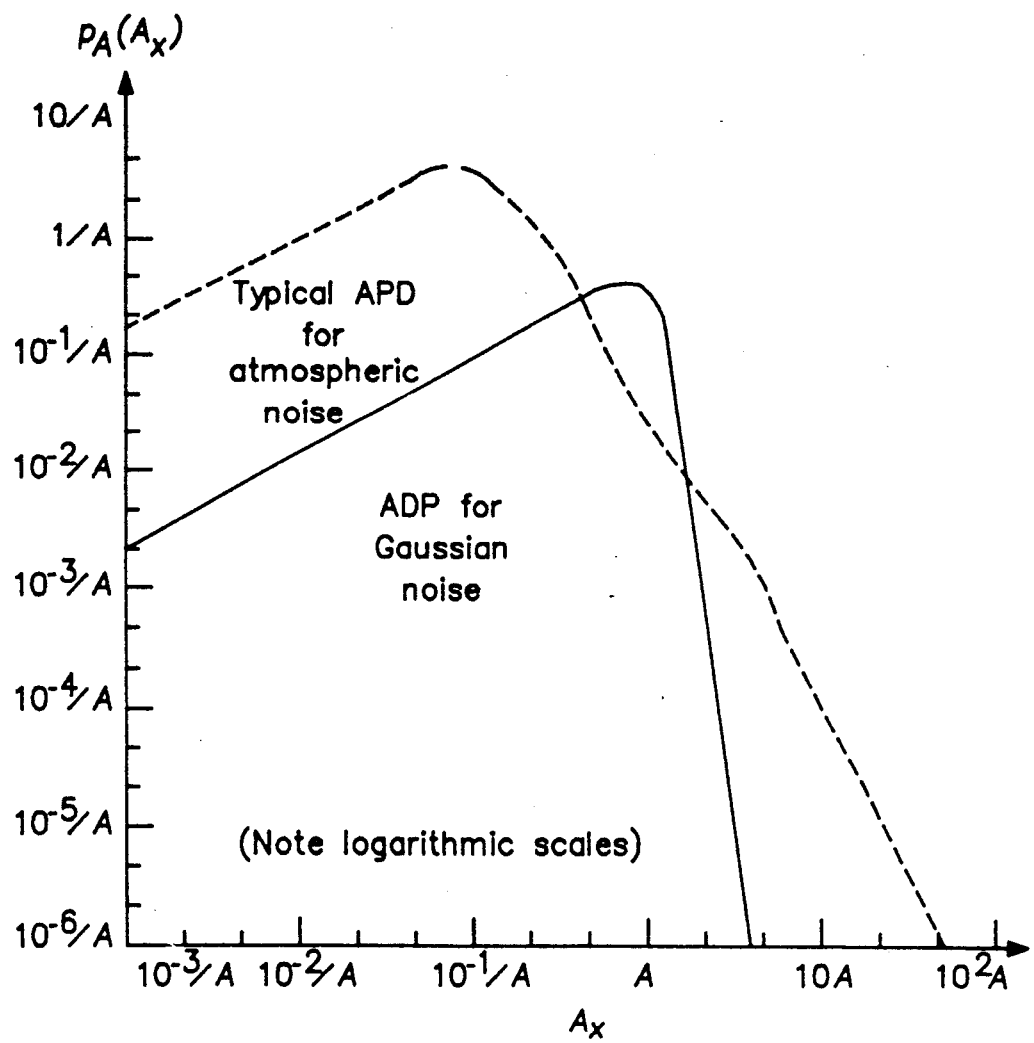
FIG. 4, consisting of FIGS. 4a and 4b, illustrates for purposes of comparison plots of amplitude probability distributions and locally-optimum nonlinearities, respectively, for Gaussian and atmospheric noise.
Figure 4B:
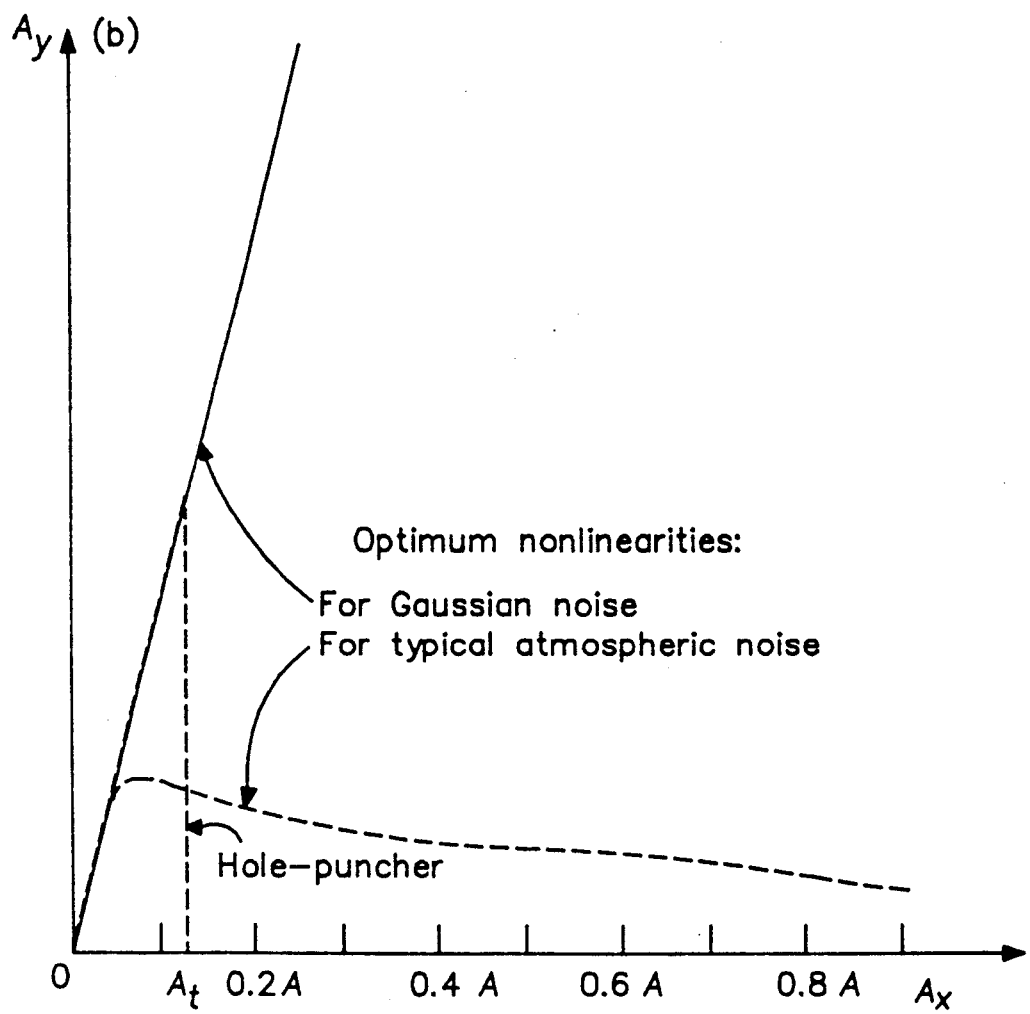

FIG. 4a compares the APD of Gaussian noise with an APD typical of atmospheric noise (ratio of arms to average noise envelope = 10 dB). The important difference is the behavior of the high-amplitude end of the distribution. In FIG. 4b optimum nonlinearities computed from Eq. (2) are compared. It can be seen that in the case of atmospheric noise, the optimum nonlinearity suppresses high amplitude input samples, similar to the hole-puncher nonlinearity that is also shown in FIG. 4b. This is expected since the hole-puncher was chosen to improve performance against impulsive interference such as atmospheric noise.

Figure 5A:
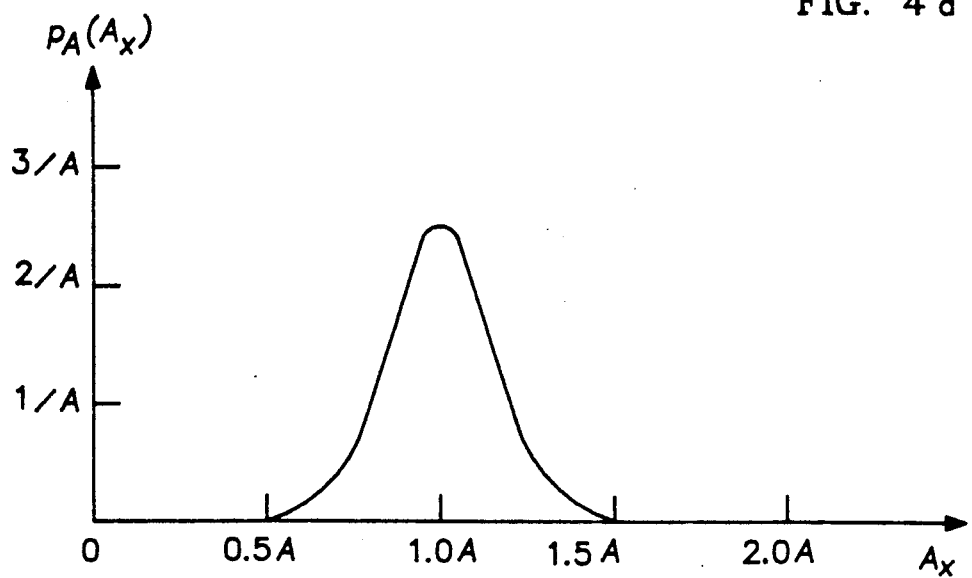
FIG. 5, consisting of FIGS. 5a and 5b, illustrates amplitude probability distribution and locally-optimum nonlinearity, respectively, for constant-amplitude interference plus Gaussian noise.
Figure 5B:
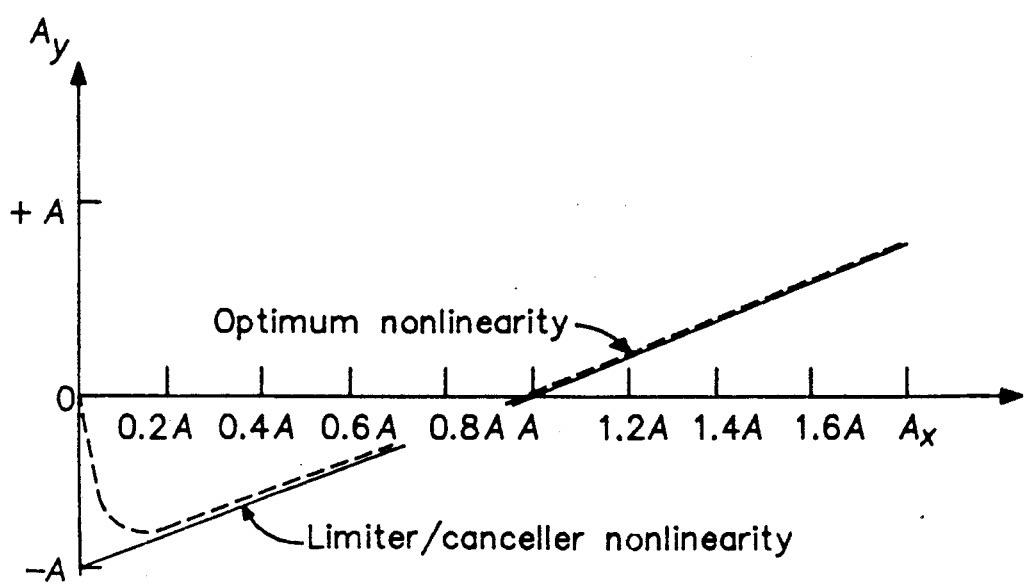

As a third example, if the interference has a constant envelope amplitude, the input amplitude, $A_x$, will be nearly constant. However, the signal of interest and other low-level interference sources such as atmospheric or thermal noise will spread out the input amplitude somewhat. As a result the APD will be a strongly peaked function such as that shown in FIG. 5a. The corresponding nonlinearity computed from Eq. (2) will depend on the shape of the APD peak. In general, it will go negative at the left edge of the main APD peak and positive at the right edge. FIG. 5b shows the particular nonlinearity resulting from the APD of FIG. 5a, which represents constant-amplitude interference added to Gaussian noise with 10 dB less power. For comparison the limiter/canceller nonlinearity is also shown in FIG. 5b.

Implementing the method of the invention requires a practical algorithm for determining the APD and from it the appropriate nonlinearity. The APD needs to be calculated using many input samples so that sampling errors due to statistical fluctuations are minimized. But the time required for the APD calculation grows rapidly with the number of samples so an efficient algorithm is required. Also, the large sample requirement conflicts with the need to keep the time interval over which the APD is measured short enough to permit adapting rapidly to changing interference statistics.

At any time, the preferred embodiment of the signal processor has n samples over which to estimate the current APD, covering the time interval, $T = n\tau$, where $\tau$ is the sample period. At the next sample time, one new sample will be added, the oldest one will be deleted, and the APD estimate will change slightly. To avoid having to repeat the entire APD calculation, an algorithm is required that computes the change in the APD when one sample is added and one deleted.

The usual way to estimate a probability distribution from a number of data samples is to "histogram" the data, that is, to divide the possible data range into a set of "bins" and then calculate how many samples have data values in each bin. The fraction of counts in each histogram bin divided by the width of the bin provides an estimate of the probability density, p(A), averaged over the bin.

In histogramming data, the number of bins is very important: If there are too few, the detailed structure of the distribution will be lost; if there are too many, the number of samples in each bin will become so small as to be meaningless. A standard way to choose bins is to divide the range from the highest data value to the lowest into equal-width bins.

Histogramming data runs into difficulties when the data are changing dynamically. For example, if a new sample is added and an old one deleted, the highest or lowest data values can change so that new bins have to be defined. In such a case, the entire set of samples may have to be histogrammed anew.

A second problem with histogramming is that it doesn't guarantee an efficient description of the APD. If most of the data are concentrated in a few bins, important information may be lost.

Figure 6A:
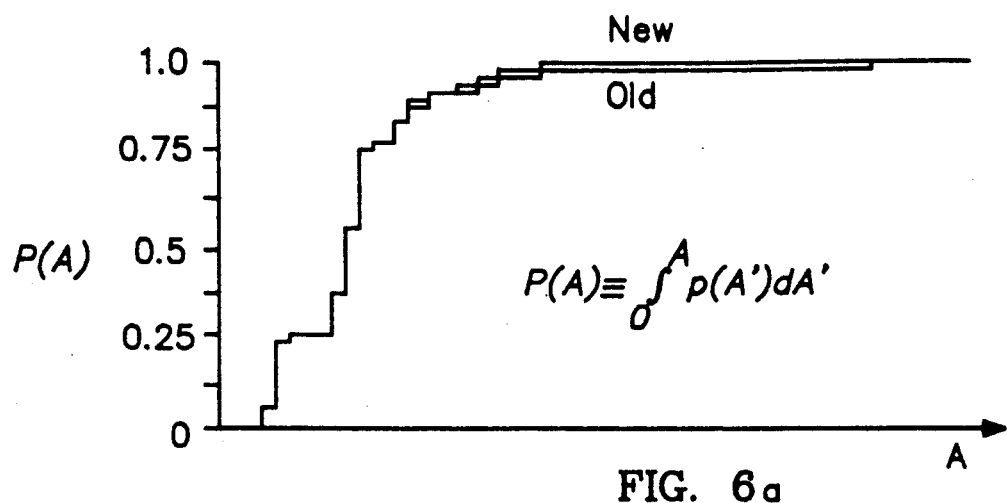
FIG. 6, consisting of FIGS. 6a, 6b and 6c, illustrates a quantile representation of an amplitude probability distribution.

For this application, a more convenient way to represent the APD is through its cumulative probability distribution, $$P_A(A) = \int_0^A p(A')dA',$$

the probability that amplitude will be A or less. FIG. 6a shows the cumulative probability distribution for a set of data in the form of amplitude "quantiles", $A_{(i)}$, the amplitude at or below which a given fraction of the measured data occurs. For example, FIG. 6b divides the data of FIG. 6a into eight parts and shows the corresponding quantiles: None of the measured data are less than the lowest measured amplitude, $A_{(0)}$, one-eight of the measured data falls at or below $A_{(1)}$, two-eights fall at or below $A_{(2)}$, and so on up to the maximum measured amplitude, $A_{(8)}$.

Figure 6B:
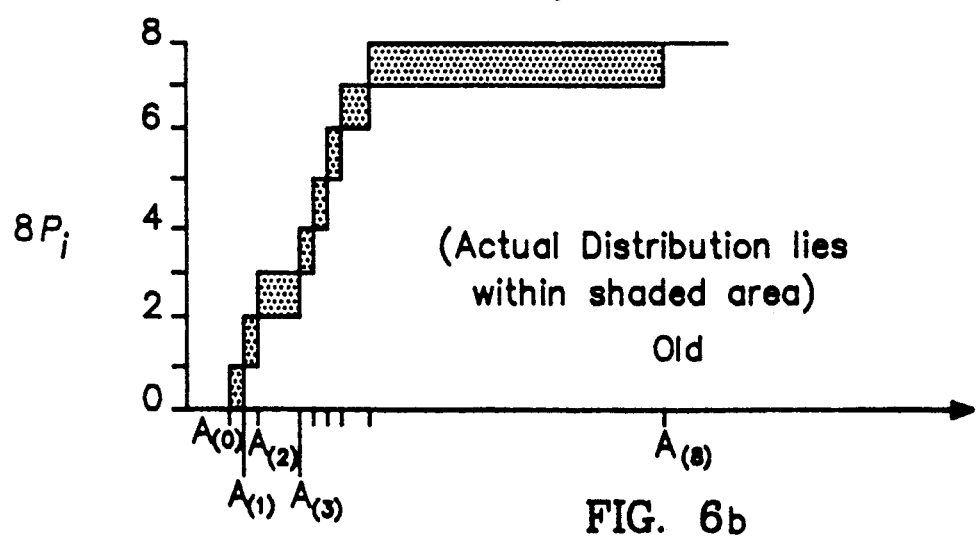
Figure 6C:
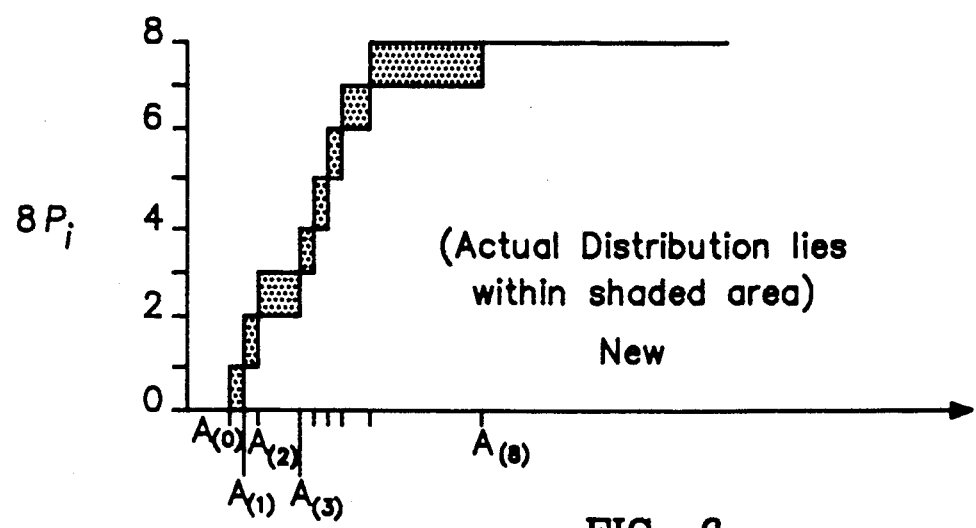

Representing an APD by quantiles has two advantages: First, when new measurements are added and old ones deleted, as shown in FIGS. 6b and 6c, the quantiles do not change as radically as histogram counts can when bins change. Only those quantiles lying between the new amplitude and the one to be deleted will change, and they can be computed in a relatively straightforward fashion. Second, since the measured data are evenly divided among quantiles, summarizing an APD via its quantiles is less likely to cause important information to be lost than using the same number of equal-bin-width histogram counts.

This approach differs from the more usual statistical analysis by moment (see, e.g., U.S. Pat. Nos. 3,833,797 to Grobman et al; 4,530,076 to Dwyer; and 4,031,364 to Wilmot) by estimating the detailed behavior of the tails of the distribution more accurately compared to the central portion. Under many conditions, it is these tails which must be estimated accurately in order to provide significant signal processing performance.

Dwyer does measure distribution quantiles for the purpose of constructing a nonlinear mapping, but it is a fixed-shape mapping (a limiter) whose "knees" or limit points are simply adjusted to be equal to the measured amplitude quantile values. By contrast, this invention derives an optimum nonlinearity from the quantile values, so that the whole shape of the mapping can change when the quantile values change. Also, Dwyer must additionally measure a distribution moment (Kurtosis) to decide whether or not to activate his fixed-shape nonlinear mapping, whereas this invention adjusts the shape of the mapping so that in the case where Dwyer would not use his, but rather send the input straight through, this invention's mapping would automatically reduce to the identity mapping, i.e., the output would be essentially the same as the input To calculate the optimum nonlinearity from quantiles of the input amplitude, Eq. (2) must be rewritten with the cumulative probability distribution, $P_A$, replacing $A_x$ as the independent variable. Using the identity $$p_A(A_x) = \frac{1}{\left(\frac{dA_x}{dP_A}\right)}$$

leads to:

$$A_y = -\left(\frac{A_s^2}{2}\right)A_x\left(\frac{d}{dP_A}\right)\left\{\frac{1}{A_x\left(\frac{dA_x}{dP_A}\right)}\right\}$$

Next, it is necessary to express this equation in terms of the $m+1$ quantiles, $A_{x(0)}, A_{x(1)}, \ldots, A_{x(m)}$, which summarize the measured estimate of the APD. This can be done using an approximation to the value of any variable, f, or of its derivative (df/dP), in terms of values evaluated "half a quantile" away:

$$f_{(i)} = (\tfrac{1}{2})\{f_{(i+\tfrac{1}{2})} + f_{(i-\tfrac{1}{2})}\},$$

$$\left(\frac{df}{dP}\right)_{(i)} = m\{f_{(i+\tfrac{1}{2})} - f_{(i-\tfrac{1}{2})}\}.$$

Only whole quantile values show up in the final equation for the nonlinearity:

$$A_{y(i)} = A_{x(i)}\left(\frac{1}{A_{x(i)}^2 - A_{x(i-1)}^2} - \frac{1}{A_{x(i+1)}^2 - A_{x(i)}^2}\right). \quad (3)$$

Eq. (3) provides the desired processor output in terms of measured input data. Each input, $A_x(t)$, is sorted according to which quantile, $A_{x(i)}$, its amplitude is nearest to, and the corresponding $A_{y(i)}$ is chosen as the output amplitude. (The constant signal amplitude, $A_s$, has been replaced with 1, as the size of the output is irrelevant as long as it is within the range required by subsequent numerical processing. This requirement is met by normalizing the final output to a fixed average value.)

It can be seen that the calculation of the nonlinearity from Eq. (3) involves only simple arithmetic. The time-consuming part is determining the input amplitude quantiles, $A_{x(i)}$, which requires an incremental sorting procedure.

An efficient algorithm for determining quantiles makes use of a rank-ordered, linked list of the n most recent samples as well as a list of the current quantile values, each with a pointer into the linked list. The quantile list permits rapid determination of the proper location for each new value in the linked list: The new value is compared to the quantiles with a binary search, the nearest lower quantile is found in the linked list using the quantile list pointer, and a sequential search through the segment of the linked list up to the next higher quantile is executed.

It will be noted that computation of the output corresponding to $i=0$ and $i=m$ (lowest and highest input quantiles) is not defined since Eq. (3) requires values for the input quantiles for $i-1$ and $i+1$. This problem is resolved by defining:

$$A_{x(-1)}^2 = -\infty, A_{x(m+1)}^2 = \infty. \quad (4)$$

In an actual processor, of course, $\infty$ will be represented by a large number. The effect of Eq. (4) is to set to zero the first term in the right-hand side of Eq. (3) for $i=0$, and the second term for $i=m$.

The choice of how best to process signals in order to suppress interference depends on what is known about the interference. If the interference APD is known, the zero-memory amplitude nonlinearity of Eq. (1) can be determined. If one uses analogous probability distributions of interference statistics formed from samples at different times or including phase information, nonlinearities with memory or involving phase as well as amplitude would result. The best interference statistics to use are those that are most predictable: Loosely speaking, the more highly concentrated the probability distribution around a small number of values, the greater the processing gain.

It is often useful to design signal processing that works against narrowband (nearly constant-frequency) interference. Since the frequency of a waveform is represented by the change in phase of its vector, it is useful to consider "phase-domain processing", that is, nonlinearities based on the phase statistics of the interference.

Figure 7:
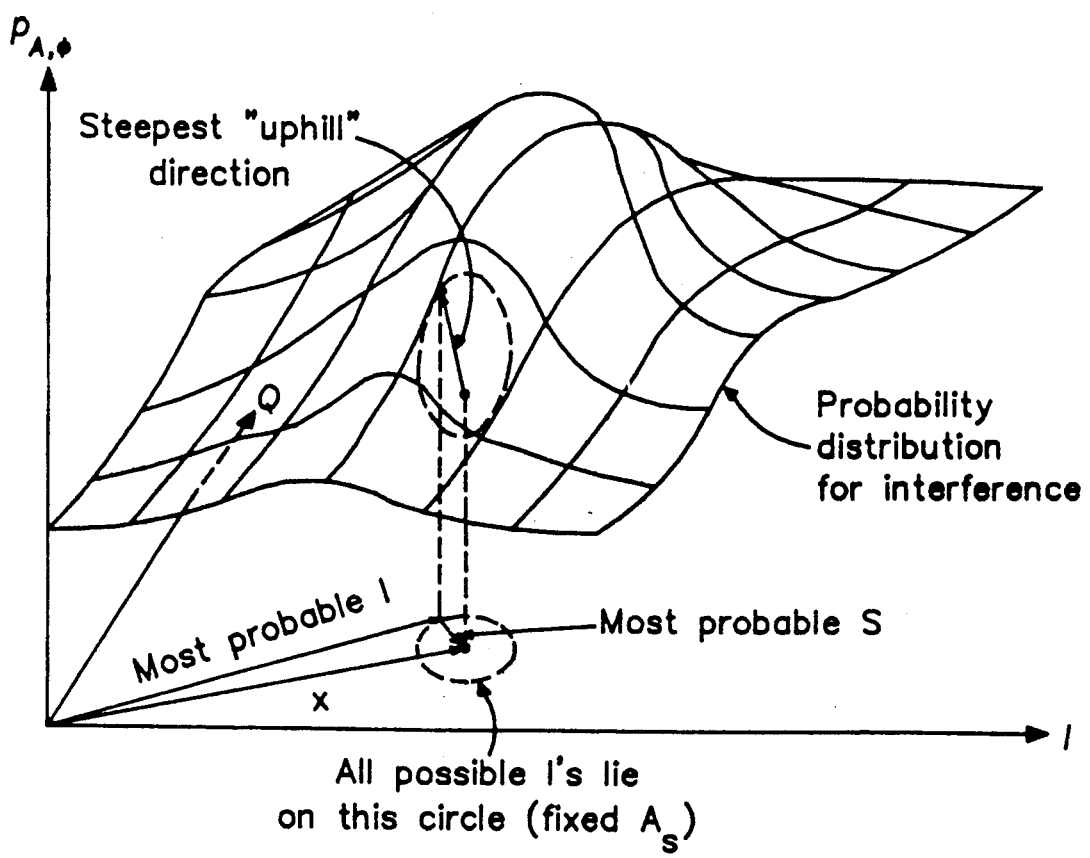
FIG. 7 illustrates a plot of a two-dimensional interference probability distribution.

In FIG. 3, the optimum weak-signal amplitude nonlinearity was developed by looking at constructive and destructive addition of signal and interference vectors in one dimension (amplitude) FIG. 7 shows the corresponding measured signal of interest-plus-interference input, x, with a small fixed amplitude for the desired signal, in the full two-dimensional case.

The possible interference vectors are now an infinite set, arranged in a circle around the measured input vector, rather than just the two possibilities of FIG. 3. The choice of the most probable interference vector is again closely related to the slope of the probability distribution at the measured point. Now, however, the probability distribution, $p_{A\phi}(A_I,\phi_I)$, may vary not only as a function of amplitude, but also as a function of phase angle. In this case, the direction of steepest slope of the probability distribution does not have to be in the same or opposite direction as x and the expected value for the weak signal, $<S>$, can have components in quadrature to x. The corresponding generalization to the optimum nonlinearity of Eq. (2) is:

$$y = <S> = \{A_y^I + jA_y^Q\}\, e^{j\phi_x}, \quad (5)$$
where

-continued $$A_y^I = -\left(\frac{A_s^2}{2}\right)\frac{\left(\frac{\partial}{\partial A_x}\right)\left(\frac{p_{A,\phi}(A_x, \phi_x)}{A_x}\right)}{\left(\frac{p_{A,\phi}(A_x, \phi_x)}{A_x}\right)}$$

and $$A_y^Q = -\left(\frac{A_s^2}{2}\right)\left(\frac{1}{A_x}\right)\frac{\left\{\frac{\partial p_{A,\phi}(A_x, \phi_x)}{\partial \phi_x}\right\}}{p_{A,\phi}(A_x, \phi_x)}.$$

Assuming that the amplitude and phase fluctuations of the interference are independent, then their joint distribution may be written as a product of separate amplitude and phase probability distributions:

$p_{A,\phi}(A_x,\phi_x) = p_A(A_x)p_{100}(\phi_x)$.

In this case the part of the output in phase with the input, $A_y^I$, is just the amplitude-domain nonlinearity of Eq. (2). The part of the output in quadrature with the input, $A_y^Q$, is the phase-domain nonlinearity:

$$A_y^Q = -\left(\frac{A_s^2}{2}\right)\left(\frac{1}{A_x}\right)\frac{\left\{\frac{dp_\phi(\phi_x)}{d\phi_x}\right\}}{p_\phi(\phi_x)}. \tag{6}$$

As it stands, Eq. (6) is not very useful because interference sources of interest will not have predictable phase angles. Even a constant-frequency waveform, unless it happens to be phase-locked to the processor frequency, will have a vector that rotates at a constant rate and is therefore equally likely at any angle. The corresponding phase distribution, $p_{100}$, doesn't change with $\phi_x$ so that $A_y^Q = 0$. It is the phase velocity (the instantaneous frequency) that will be predictable (constant) and that should therefore be the chosen interference statistic to use as the basis for the phase-domain nonlinearity.

The phase velocity is measured by the difference in successive phase samples so the analogous approach to the nonlinear amplitude-domain process is to form a phase velocity probability distribution (PVPD) from a large number of phase differences calculated from consecutive sample pairs. The PVPD can then be used in Eq. (6) in place of the phase distribution. Since each phase difference value, $\Delta\phi_x$, is the result of phase measurements at two different times, $$\Delta\phi_x\left(t - \frac{\tau}{2}\right) = \phi_x(t) - \phi_x(t-\tau),$$

the slope of the PVPD with changes in phase can be related to its slope with changes in the phase difference by the relation:

$$\left(\frac{d}{d\phi_x}\right) \text{for } \phi_x \text{ at time } t = \left(\frac{d}{d\Delta\phi_x}\right) \text{for } \Delta\phi_x \text{ at time } t - \frac{\tau}{2} -$$

$$\left(\frac{d}{d\Delta\phi_x}\right) \text{for } \Delta\phi_x \text{ at time } t + \frac{\tau}{2}.$$

The phase-domain nonlinearity resulting from the PVPD is therefore:

$$A_y^Q(t) = \tag{7}$$

$$-\left(\frac{A_s^2}{2}\right)\left\{\frac{1}{A_x(t)}\right\}\left\{\frac{\left[\frac{dp_{\Delta\phi}\left(\Delta\phi_x\left(t-\frac{\tau}{2}\right)\right)}{d\Delta\phi_x}\right]}{p_{\Delta\phi}\left(\Delta\phi_x\left(t-\frac{\tau}{2}\right)\right)} - \frac{\left[\frac{dp_{\Delta\phi}\left(\Delta\phi_x\left(t+\frac{\tau}{2}\right)\right)}{d\Delta\phi_x}\right]}{p_{\Delta\phi}\left(\Delta\phi_x\left(t+\frac{\tau}{2}\right)\right)}\right\}.$$

It provides performance improvement under a different set of conditions than the amplitude nonlinearity of Eq. (2) and therefore increases the range of interference types against which the processor is effective.

The nonlinearity of Eq. (7) differs from the amplitude nonlinearity also in the fact that it has "memory", i.e., the output at a given time depends not only on the input at that time but also on the previous and next input samples. This is a much shorter memory than a filter would typically have, even though both devices are useful against narrowband interference.

Although this phase-domain nonlinear processing is similar in effect to filtering, there are some important differences. Filtering is generally more effective than a phase-velocity nonlinearity when the interference consists of multiple narrowband components at several different frequencies, such as electromagnetic interference due to power-line harmonics. On the other hand, phase-velocity nonlinearities are effective against interference whose instantaneous frequencies are concentrated at several different values, such as frequency-shift keying waveforms used in communications. In particular, if a receiver listening to such a waveform is interfered with by another signal of the same modulation type, the interference can be suppressed by the phase-domain nonlinearity whereas filtering will not help.

In the same way that the APD was summarized by the measured amplitude quantiles in order to permit numerical implementation, Eq. (7) can be rewritten in terms of the measured phase difference quantiles, $\Delta\phi_{x(i)}$:

$$A_y^Q(t) = \left\{\frac{1}{2A_x(t)}\right\}\{a_{y(i)}^Q - a_{y(j)}^Q\}, \tag{8a}$$

where $$a_{y(i)}^Q = \frac{1}{\Delta\phi_{x(i)} - \Delta\phi_{x(i-1)}} - \frac{1}{\Delta\phi_{x(i+1)} - \Delta\phi_{x(i)}}. \tag{8b}$$

The quantile, $\Delta\phi_{x(i)}$, is chosen as that nearest to the measured value of $\Delta\phi_x(t-\tau/2)$, wherea chosen as the nearest quantile to $\Delta\phi_x(t+\tau/2)$. As the constant As has been replaced with 1.

Amplitude and phase-domain nonlinearities can operate simultaneously and independently, their outputs summed as indicated by Eq. (5). The normalization of the output amplitude, which is discussed below, is performed after summing. This is important since the output amplitude of each process is a measure of its effectiveness, and if one of the processes is not doing any good, its output will decrease and allow the other to dominate the output sum.

The two nonlinearities relating to amplitude and phase velocity discussed so far do not take advantage of the possible medium time-scale predictability of the interference, i.e., of non-vanishing autocorrelation at time intervals between roughly 2 to 1000 samples. Such predictability is quite common. One example occurs when the interference energy is contained in a narrow band of the spectrum. (This occurs for bandwidths in the range of 1 Hz to a few hundred Hz, for a sample rate of 1 kHz).

To take advantage of longer time-scale interference predictability without large increases in computational complexity, one can use the same nonlinearities relating to amplitude and phase-velocity, but compute and apply them in the frequency domain rather than the time domain. This is accomplished by performing a discrete Fourier Transform (DFT) on the input signal prior to applying the nonlinearities and then performing an inverse DFT on the output. As a result, the distributions which are used to compute the adaptive nonlinear transforms (output) are distributions of amplitudes and phase derivatives derivatives for Fourier components of the input signal of interest-plus-interference rather than for the input signal of interest-plus-interference itself. Since the medium time-scale predictability of the interference shows up in the frequency domain, the nonlinearities are able to take advantage of it. In the same way that the amplitude/phase velocity nonlinearities ignore time-domain behavior, the nonlinearities, as modified, ignore frequency-domain behavior, since all frequency components contribute on an equal footing to the distributions, and are transformed by the same nonlinearity.

This frequency-domain nonlinearity can be combined with the original time-domain nonlinearity by simply letting both processes operate simultaneously and summing their outputs prior to normalization. This will ensure that whichever process is providing the most gain will dominate the output.

The process outlined above can be modified to account for the non-uniform distribution of the desired signal in the frequency domain, i.e., each frequency component should be weighted inversely according to the amount of signal energy expected (for example, the skirt frequencies at which the desired signal's power spectrum is falling off should be pre-emphasized) right after the DFT is performed. This pre-enphasis will ensure that each frequency sample will have a constant-amplitude signal contribution (on average) when it is input to the amplitude/phase velocity nonlinearities. (A constant amplitude signal of interest is assumed in the amplitude/phase velocity nonlinearity derivation.) After nonlinear processing the inverse of this weighting (de-emphasis) should be applied to regain the correct spectral balance just prior to inverse DFT.

The frequency-domain nonlinearity introduces a new parameter, M, the number of points in the complex DFT. Note that after a block of M complex time-domain samples are input and the DFT is performed on them to produce M complex frequency-domain samples, these M new samples are simply concatenated to the previous M samples (as if they were an extension to higher frequencies) and fed to the amplitude/phase velocity nonlinearities. The amplitude/phase velocity nonlinearities normally recompute their nonlinear (output) for each sample, based on a "sliding window" neighborhood of N data points surrounding that sample. The data output by the amplitude/phase velocity nonlinearities is then regrouped in blocks of M points for inverse DFT and final time-domain output. This is called herein the "Type I" process.

It is possible to modify the amplitude/phase velocity nonlinearities to make them recompute their nonlinear transformation only once per M-sample block of data. This (designated herein) "Type II" approach prevents using, at a given time, only some frequency components from the oldest block of data and using only others from the newest block of data, and can reduce computational load.

The choice of M is to be made based on processing-time considerations (the time required per sample for DFT and inverse DFT grows as log M) and on the characteristics of the interference environment of interest. Two possible choices are:

1. Type I or II with $M=\sqrt{N}$. Statistics are computed on M different spectra, each containing M different frequencies, so that statistical fluctuations in time and frequency domains are balanced.

2. Type II with $M=N$. The finest frequency resolution (sample rate divided by N) is obtained, and only one spectrum is used at a time to estimate an optimum non-linearity. This approach can be expected to decrease computational load since the nonlinearity estimation is performed only once every N samples.

Figure 8:
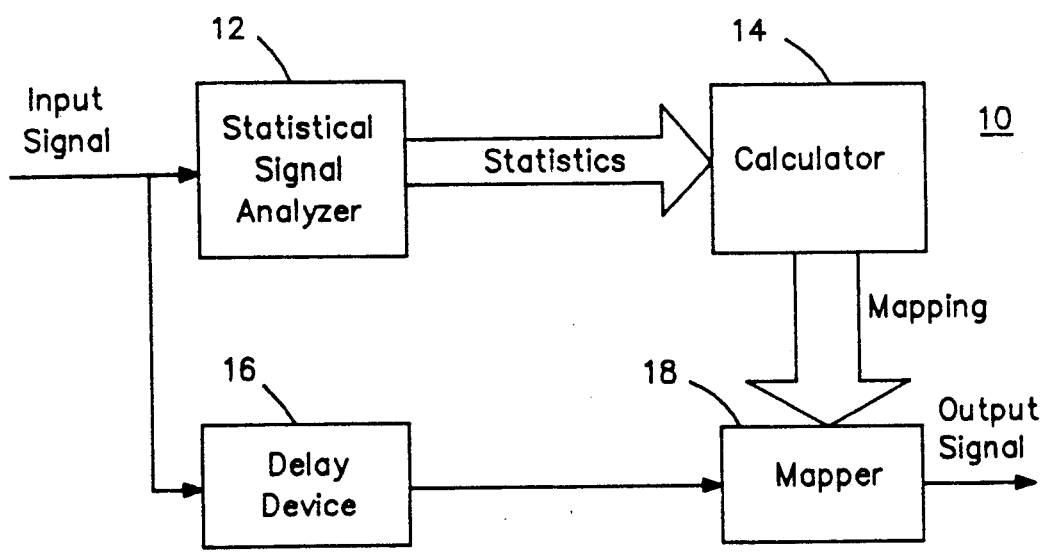
FIG. 8 illustrates a block diagram of a signal processor.

The invention is implemented in hardware, as shown in FIG. 8, in a processor 10 which consists of four elements. The input signal is characterized by estimating its statistics using a statistical signal analyzer 12. Based on this characterization a map or mapping, in general a nonlinear one, is determined by a calculator 14 using the appropriate equation, e.g., eq. (3) or eq. (8a) and (8b), under the assumption that the input signal is dominated by the interference to be removed and therefore:

a. the input signal statistics from the analyzer 12 are a good estimate of the interference statistics, and
b. the appropriate map or mapping is the one calculated when S/I is much less than one, i.e., the "locally-optimum" detection mapping.

The input signal is also routed through an optional first delay device 16 to a mapper 18 which transforms it according to the locally-optimum detection mapping provided by the calculator 14. The first delay device 16 enables the mapper 18 to operate on each signal sample with a mapping computed from statistics of signal samples taken both before and after the sample being worked on, instead of only previous data samples. This increases the accuracy of the mapping when fluctuating statistics are causing it to change rapidly.

Signal samples are routed to the output through the first delay device 16 and the mapper 18 at the required output rate. If the analyzer 12 or calculator 14 are not able to perform their required functions at the output sample rate, signal samples may be routed to the statistical signal analyzer 12, or a full new set of statistics may be sent from the analyzer 12 to the calculator 14, or a full new mapping may be determined by the calculator 14, at a slower rate.

A signal processing system may contain several processors 10 which differ in the particular dynamic variable(s) each processor 10 uses to characterize the input signal by its corresponding statistical signal analyzer 12.

The associated calculator 14 and mapper 18 must also be designed for the particular variable used.

The application of a locally-optimum mapping calculated adaptively from the statistics of the input signal is a novel approach which differs from other signal processing techniques as discussed previously.

In a preferred embodiment of the invention, as described above, the statistical signal analyzer 12 characterizes the input signal solely by estimating a set of quantiles (for example, the smallest value, the largest value, and the nine intermediate deciles) of the probability distribution of one or more dynamic variables of the input signal, such as the amplitude or phase velocity.

Figure 9:
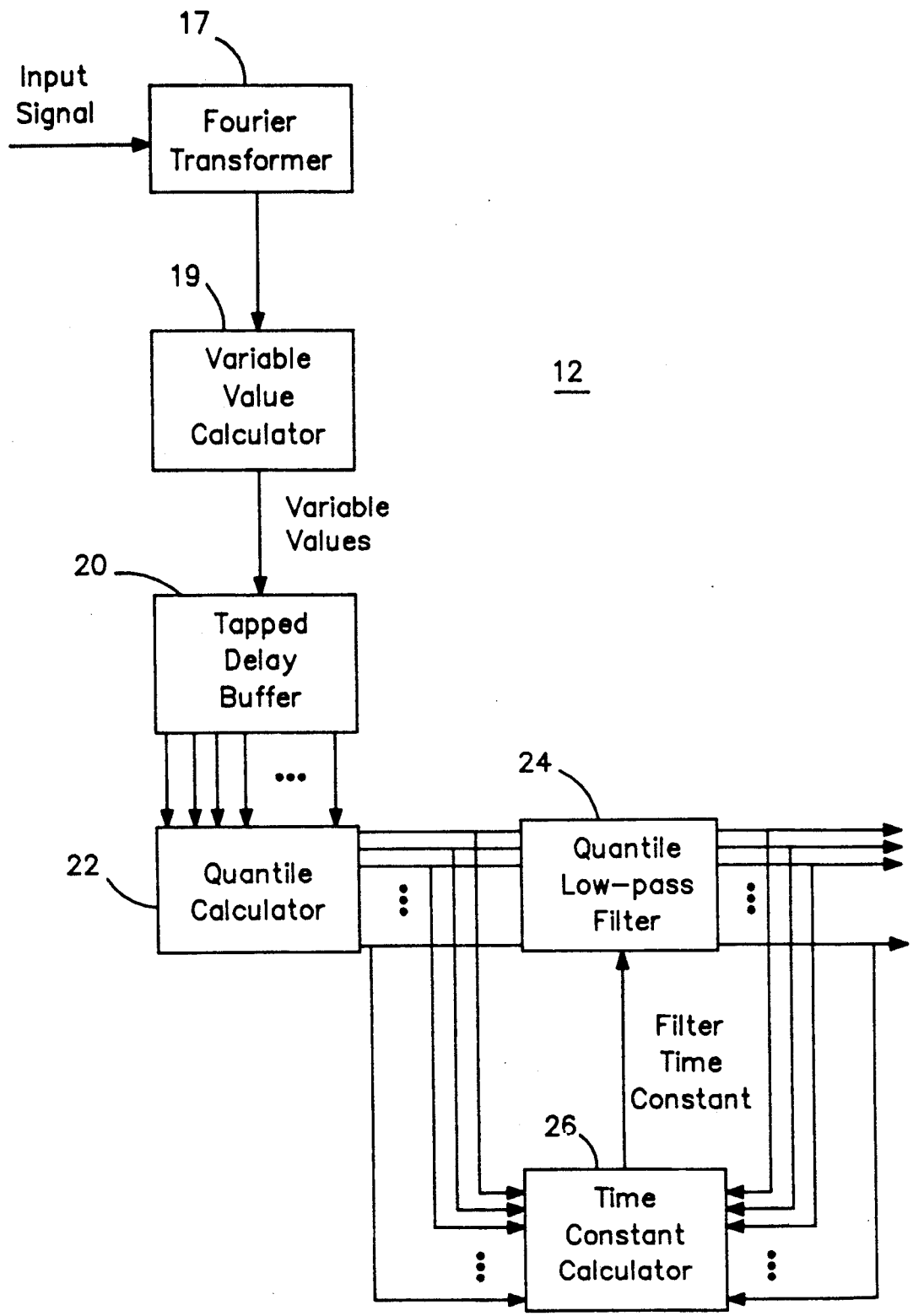
FIG. 9 illustrates a block diagram of a statistical signal analyzer.

The statistical signal analyzer 12 of the preferred embodiment estimates quantiles for a given variable of the input signal as shown in FIG. 9. The input signal is applied to an optional Fourier transformer 17 (in the case of the Fourier transformed dynamic variables (e) or (f) listed above) and the values of the variable(s) of interest are determined by a variable value calculator 19. (For example if the input signal is given by its in-phase and quadrature components, I and Q, and the variable of interest is amplitude, A, then the variable value calculator 19 performs the $A = \sqrt{I^2 + Q^2}$ computation.)

Variable values are stored in a tapped delay buffer 20 covering the period over which statistics are to be calculated. This length will normally correspond to about twice the delay introduced by the first delay device 16 so that at any time, an equal amount of data before and after the sample being mapped is used by the statistical signal analyzer 12 and calculator 14 to determine that mapping.

Variable values for all delay times from zero through the full buffer length are made available to the quantile calculator 22 by the tapped delay buffer 20. The quantile calculator 22 determines the value of some fixed number of quantiles of the variables in the tapped delay buffer 20. The quantiles correspond to equal probability spacing and range from the minimum to the maximum value. The number of quantiles is chosen to be large enough to provide adequate resolution of the anticipated distributions of the variable without being so large as to require excessive processing time in the subsequent stages of the statistical signal analyzer 12 or in the calculator 14 or mapper 18.

The quantiles from the quantile calculator 22 are then time-averaged by a quantile low-pass filter 24 in order to reduce the impact of statistical ("sampling") fluctuations. The filter time constant is adaptively determined by a time constant calculator 26 which compares the measured quantile values from the quantile calculator 22 with the time-averaged quantile values from the quantile low-pass filter 24. Whenever a given measured quantile lies outside the bounds formed by the time-averaged values of the adjacent quantiles, the time constant calculator 26 generates a negative contribution to the time constant. It also generates a positive contribution at a steady rate. As a result, the time constant moves to lower values when out-of-bound quantiles are encountered at a high rate (indicative of rapidly changing statistics which should not be filtered with a large time constant if the statistical signal analyzer 12 is to follow these changes with agility). Conversely, the time constant moves to higher values when out-of-bound quantiles occur only rarely (so that statistical fluctuations may be more strongly suppressed and mapping accuracy be improved).

Such a means of adaptively controlling the time constant of a filtered distribution estimate does not appear in the prior art. See, e.g., U.S. Pat. No. 4,774,682 to White which deals with time-varying statistics but not with variable speed of adaptation.

The calculator 14 determines the mapping to be applied to the input signal by the mapper 18. It uses the estimated interference distribution determined by the statistical signal analyzer 12 and represented by a set of time-averaged quantiles for the particular variable analyzed. The calculator 14 first computes a locally optimum mapping directly from the quantiles, or from the time-averaged quantiles, using an equation appropriate to the variable chosen as developed above. For example, if the variable is amplitude, the known locally-optimum zero-memory amplitude nonlinearity (Eq. (2)) (cast in terms of amplitude quantiles Eq. (3)) is used. For other choices of variable the appropriate locally-optimum mapPing may be less familiar but can nonetheless be determined mathematically in a straightforward way from the assumption that S/I is much less than 1. In the preferred embodiment, this mapping is then smoothed to reduce differences between mapping values at adjacent quantiles. This is done to further reduce the impact of statistical fluctuations in the sampled variable.

The mapper 18 applies the mapping to the (optionally delayed) input signal, for example by determining which quantile is closest to the value of the selected dynamic variable of the input sample being mapped and selecting the mapping value for that quantile as a output dynamic variable. (In the preferred embodiment, the mapper 18 doesn't recalculate the value of the dynamic variable of the input but uses the value previously determined by the variable value calculator 19. The tapped delay buffer 20 then does double duty as the first delay device 16 which feeds the mapper 18.) The mapper 18 must then use the output dynamic variable to computer the signal output. This operation depends on wheat the output dynamic variable is and may include an inverse Fourier transform if the optical Fourier Transformer 17 is present. For example, if the dynamic variable is amplitude so that the output dynamic variable is $A_y$, and if the output signal is specified in terms of its in phase and quadrature components, $I_y$ and $Q_y$, then the mapper must computer:

$$I_y = A_y (I_x / \sqrt{I_x^2 + Q_x^2}),$$

$$Q_y = A_y (Q_x / \sqrt{I_x^2 + Q_x^2}),$$

where $I_x$, are input signal in phase and quadrature components. If the dynamic variable is phase velocity, the output dynamic variable is $a_y Q$ as given in eq. (8b) and the mapper must compute $A_y Q$ as given in eq. (8a), using $A_x = \sqrt{I^2_x + Q^2_x}$, and then the output signal components:

$$I_y = -A_y Q (Q_x / \sqrt{I_x^2 + Q_x^2}),$$

$$Q_y = Q_y Q (I_x / \sqrt{I_x^2 + Q_x^2}).$$

Figure 10:
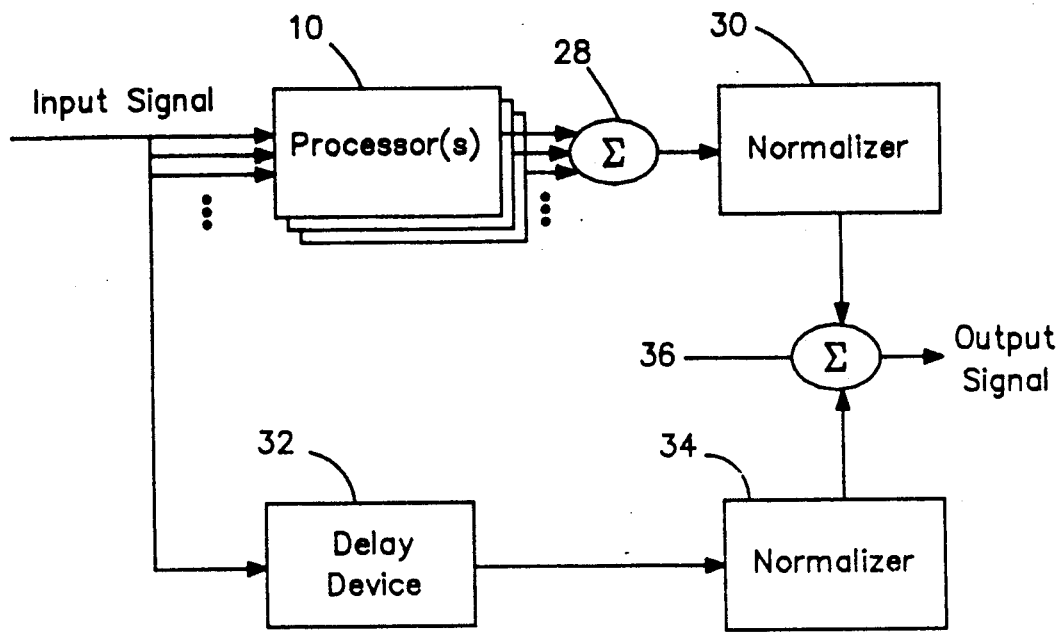
FIG. 10 illustrates a block diagram of a signal processing system.

The overall signal processing system utilizing the Adaptive Locally-Optimum Detection Signal Processor 10 is shown if FIG. 10. The input signal is assumed to contain the signal of interest plus unwanted interference. The input signal is processed by a set of one or more processor 10 whose outputs are summed by a first adder 28. The processors 10 are designed to reduce interference when such interference dominates the input signal.

Optionally, additional elements as shown in FIG. 10 may also be included in the overall signal processing system. These additional elements include: a first normalizer 30 whose function is to bring the processed input signal to a first average, e.g., absolute value or root-mean-square (rms), level, a second delay device 32 whose function is to delay the input signal by an amount equal to that engendered by the processors 10, a second normalizer 34 which brings the delayed input signal to a second average level and whose averaging time constant may be different from that of first normalizer 30 in order to improve performance against interference whose level fluctuates, and a second Adder 36 which sums the various signals to create the output signal.

The additional elements are designed to maintain a usable ratio of signal of interest to interference (S/I) in the output signal as long as the S/I at the input is above some minimum value. Specifically, when the S/I at the input is high enough, the processor 10 does not provide a usable output and the alternate path through the second delay device 32 and the second normalizer 34 is required to keep the output S/I in the usable range. This approach depends on the assumption that the correlation process which acts on the system's output signal requires only a small S/I (substantially less than 1).

This means of maintaining performance when S/I is too large for locally-optimum detection is believed to be novel. It is an alternative to providing two independent correlators, one for the unprocessed input signal and one for the signal output by the processors 10, and has the advantage of requiring only a single correlator. Another way to deal with the problem of a too large S/I is to provide some sort of decision mechanism, e.g. U.S. Pat. No. 3,478,268 to Coviello, but such mechanisms are either unreliable in some interference environments (such as an interference waveform with the same modulation type as, but uncorrelated with, the signal of interest) or require finite time to determine when the appropriate output must be switched, during which the signal of interest may be lost.

I claim:

1. A signal processor for suppressing interference in an input signal comprising:
   (a) means for estimating a set of quantiles of the probability distribution of a dynamic variable of said input signal;
   (b) means for calculating a mapping from said set of quantiles; and
   (c) means for applying said mapping to said input signal to suppress said interference; wherein said mapping provides locally-optimum detection of a signal of interest.

2. The signal processor as recited in claim 1, further comprising:
   (d) means for delaying said input signal to permit said mapping applying means to operate on said input signal with a mapping calculated from said set of quantiles of input signals received both before and after said input signal.

3. The signal processor as recited in claim 1, wherein said set of quantiles estimating means further comprises means for applying a Fourier transform to said input signal.

4. The signal processor as recited in claim 1 or claim 3, wherein said dynamic variable is the envelope amplitude of said input signal.

5. The signal processor as recited in claim 1 or claim 3, wherein said dynamic variable is the phase velocity of said input signal.

6. The signal processor as recited in claim 1, wherein said set of quantiles estimating means comprises:
   means for calculating the values of said dynamic variable of said input signal at multiple times;
   means for temporarily storing said values;
   means for estimating a set of quantiles of the probability distribution of said dynamic variable using said values;
   means for time averaging said set of quantiles; and
   means for adaptively determining the time constant for averaging said set of quantiles.

7. The signal processor as recited in claim 6, wherein said mapping calculating means further comprises means for reducing differences between values of said mapping at adjacent quantiles to reduce the impact of statistical fluctuations in said quantile estimates.

8. The signal processor as recited in claim 1 or claim 7, wherein said mapping applying means comprises:
   means for determining which quantile in said set of quantiles is closest to said dynamic variable of said input signal and selecting said mapping for said closest quantile as the output dynamic variable; and
   means for calculating an output signal component from said output dynamic variable.

9. A signal processing system for providing a usable output signal when a signal of interest is too large compared to the interference in an input signal to permit locally-optimum detection comprising:
   (a) the signal processor of claim 1;
   (b) a first normalizing means for normalizing said signal processor output to a first average level;
   (c) means for delaying said input signal by a time interval equal to that engendered by said signal processor;
   (d) a second normalizing means for normalizing said delayed input signal to a second average level; and
   (e) means for summing said normalized signal processor output and said normalized delayed input signal to create an output signal.

10. A signal processing system for suppressing interference in an input signal comprising:
    (a) at least two signal processors of claim 1, wherein each signal processor utilizes a different dynamic variable of said input signal; and
    (b) means for summing the outputs from said signal processors.

11. A signal processing system for providing a usable output signal when a signal of interest is too large compared to the interference in an input signal to permit locally-optimum detection comprising:
    (a) the signal processing system of claim 10;
    (b) a first normalizing means for normalizing said signal processing system output to a first average level;
    (c) means for delaying said input signal by a time interval equal to that engendered by said signal processing system;
    (d) a second normalizing means for normalizing said delayed input signal to a second average level; and (e) means for summing said normalized signal processing system output and said normalized delayed input signal to create an output signal.

12. A signal processor from suppressing interference in an input signal comprising;
   (a) means for determining the amplitude probability distribution (APD) of said input signal;
   (b) means for calculating the nonlinear amplitude mapping for locally-optimum detection using said APD; and
   (c) means for applying said nonlinear amplitude mapping to said input signal to suppress said interference.

13. A signal processor for suppressing interference in an input signal comprising:
   (a) means for determining the phase velocity probability distribution (PVPD) of said input signal;
   (b) means for calculating the nonlinear phase-domain mapping for locally-optimum detection using said PVPD; and
   (c) means for applying said nonlinear phase-domain mapping to said input signal to suppress said interference.

14. A method for providing a usable output signal when a signal of interest is too large compared to the interference in an input signal to permit locally-optimum detection comprising the steps of:
   (a) suppressing interference in an input signal using the method of claim 13;
   (b) normalizing a signal resulting from said method of claim 13, to a first average level using a first normalizing means;
   (c) delaying said input signal by a time interval equal to that engendered by said method of claim 13;
   (d) normalizing said delayed input signal to a second average level using a second normalizing means; and
   (e) summing said normalized signal resulting from said method of claim 13 and said normalized delayed input signal to create an output signal.

15. A signal processing system for suppressing interference in an input signal comprising:
   (a) means for determining the amplitude probability distribution (APD) of said input signal;
   (b) means for calculating the nonlinear amplitude mapping for locally-optimum detection using said APD;
   (c) means for applying said nonlinear amplitude mapping to said input signal to provide an output signal in which said interference is suppressed;
   (d) means for determining the phase velocity probability distribution (PVPD) of said input signal;
   (e) means for calculating the nonlinear phase-domain mapping for locally-optimum detecting using said PVPD;
   (f) means for applying said nonlinear phase-domain mapping to said input signal to provide an output signal in which said interference is suppressed; and
   (g) means for summing said output resulting from applying said amplitude mapping and said output resulting from applying said phase-domain mapping to further increase suppression of said interference.

16. A method for suppressing interference in an input signal comprising the steps of:
   (a) estimating a set of quantiles of the probability distribution of a dynamic variable of said input signal;;
   (b) calculating from said set of quantiles a mapping; and
   (c) applying said mapping to said input signal to suppress said interference; wherein said mapping provides locally-optimum detection of a signal of interest.

17. The method of claim 16, wherein said dynamic variable is the envelope amplitude of said input signal.

18. The method of claim 17, wherein said mapping is calculated using mathematical relationship between said set of quantiles representing said amplitude probability distribution (APD) and said mapping.

19. The method of claim 15, wherein said mathematical relationship when said APD is represented by said set of quantiles is:

$$A_{y(i)} = A_{x(i)} \left( \frac{1}{A^2_{x(i)} - A^2_{x(i-1)}} - \frac{1}{A^2_{x(i+1)} - A^2_{x(i)}} \right).$$

20. The method of claim 16, wherein said dynamic variable is the phase velocity of said input signal.

21. The method of claim 20, wherein said mapping is calculated using a mathematical relationship between said set of quantiles representing said phase velocity probability distribution (PVPD) and said mapping.

22. The method of claim 21, wherein said mathematical relationship when said PVPD is represented by said set of quantiles is:

$$A_y Q(t) = \left\{ \frac{1}{2 A_x(t)} \right\} \{a^Q_{y(i)} - a^Q_{y(j)}\},$$

where $$a^Q_{y(i)} = \frac{1}{\Delta \phi_{x(i)} - \Delta \phi_{x(i-1)}} - \frac{1}{\Delta \phi_{x(i+1)} - \Delta \phi_{x(i)}}.$$

23. The method of claim 16, further comprising the steps of:
   (d) performing a Fourier transform on said input signal; and
   (e) performing an inverse Fourier transform to obtain a signal output.

24. The method of claim 16, wherein said set of quantiles estimating step comprises the steps of:
   calculating the values of said dynamic variable of said input signal at multiple times;
   storing temporarily said values;
   estimating a set of quantiles of the probability distribution of said dynamic variable using said values;
   time averaging said set of quantiles; and
   determining adaptively the time constant for averaging said set of quantiles.

25. The method of claim 16, wherein said mapping calculating step further comprises the step of reducing differences between values of said mapping at adjacent quantiles to reduce the impact of statistical fluctuations in said quantile estimates.

26. The method of claim 16, wherein said mapping applying step comprises the steps of:
   determining which quantile in said set of quantiles is closest to said dynamic variable of said input signal;
   selecting said mapping for said closest quantile as the output dynamic variable; and calculating an output signal component from said output dynamic variable.

27. The method for suppressing interference in an input signal comprising the steps of:
  (a) estimating the amplitude probability distribution (APD) of said input signal;
  (b) calculating from said APD a mapping using a mathematical relationship between said APD and said mapping; and
  (c) applying said mapping to said input signal to suppress said interference; wherein said mapping provides locally-optimum detection of a signal of interest.

28. The method of claim 27, wherein said mathematical relationship is:
$$y = (S) = A_y e^{j\phi_x},$$

where $$A_y = -\left(\frac{A_s^2}{2}\right) \frac{\left(\frac{d}{dA_x}\right)\left(\frac{p_A(A_x)}{A_x}\right)}{\left(\frac{p(A_x)}{A_x}\right)}.$$

29. A method for suppressing interference in an input signal comprising the steps of:
  (a) estimating the phase velocity probability distribution (PVPD) of said input signal;
  (b) calculating from said PVPD a mapping using a mathematical relationship between said PVPD and said mapping; and
  (c) applying said mapping to said input signal to suppress said interference; wherein said mapping provides locally-optimum detection of a signal of interest.

30. The method of claim 29, wherein said mathematical relationship is:
$$y = (S) = \{A_y^Q + jA_y^Q\} e^{j\phi_x},$$

where $$A_y^I = \left(\frac{A_s^2}{2}\right) \frac{\left(\frac{\partial}{\partial A_x}\right)\left(\frac{p_{A,\phi}(A_x, \phi_x)}{A_x}\right)}{\left(\frac{p_{A,\phi}(A_x, \phi_x)}{A_x}\right)}$$

and $$A_y^Q(t) =$$

$$-\left(\frac{A_s^2}{2}\right)\left(\frac{1}{A_x(t)}\right)\left\{\frac{\left[\frac{dp_{\Delta\phi}\left\{\Delta\phi_x\left(t-\frac{\tau}{2}\right)\right\}}{d\Delta\phi_x}\right]}{p_{\Delta\phi}\left\{\Delta\phi_x\left(t-\frac{\tau}{2}\right)\right\}} - \frac{\left[\frac{dp_{\Delta\phi}\left\{\Delta\phi_x\left(t+\frac{\tau}{2}\right)\right\}}{d\Delta\phi_x}\right]}{p_{\Delta\phi}\left\{\Delta\phi_x\left(t+\frac{\tau}{2}\right)\right\}}\right\}$$

* * * * *

UNITED STATES PATENT AND TRADEMARK OFFICE
CERTIFICATE OF CORRECTION

PATENT NO. : 5,018,088
DATED : May 21, 1991
INVENTOR(S) : James H. Higbie

It is certified that error appears in the above—identified patent and that said Letters Patent is hereby corrected as shown below:

Column 19, lines, 29, 31, 34, and 39, delete "13" and substitute therefor in each occurrence -- 16 --.

Column 20, line 13, delete "15" and substitute therefor -- 18 --.

Column 20, line 63, after "16" insert -- or claim 25 --.

Column 21, line 16, delete " $y=(S)=A_y\theta^{j\phi x},$ " and substitute therefor -- $y=(S)=A_y e^{j\phi x},$ --.

Column 22, line 5, delete the first occurrence of "Q" and substitute therefore -- I --.

Column 22, line 12, after "=" insert -- - --.

Signed and Sealed this

Twenty-eighth Day of April, 1992

Attest:

HARRY F. MANBECK, JR.

Attesting Officer          Commissioner of Patents and Trademarks